United States Patent
Di Giandomenico et al.

(10) Patent No.: US 7,460,046 B2
(45) Date of Patent: Dec. 2, 2008

(54) SIGMA-DELTA MODULATORS

(75) Inventors: Antonio Di Giandomenico, Velden am Woerthersee (AT); Luis Hernandez, Madrid (ES); Susana Paton, Madrid (ES); David San Segundo Bello, Villach (AT); Manuel Sanchez-Renedo, Madrid (ES); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/644,448

(22) Filed: Dec. 22, 2006

(65) Prior Publication Data

US 2008/0150776 A1 Jun. 26, 2008

(51) Int. Cl.
*H03M 3/00* (2006.01)
(52) U.S. Cl. .................................... 341/143; 341/77
(58) Field of Classification Search ................ 341/143
See application file for complete search history.

(56) References Cited

U.S. PATENT DOCUMENTS

| | | | | |
|---|---|---|---|---|
| 4,862,169 | A * | 8/1989 | van Bavel et al. | 341/143 |
| 5,068,661 | A * | 11/1991 | Kaneaki et al. | 341/143 |
| 5,103,229 | A * | 4/1992 | Ribner | 341/143 |
| 5,124,703 | A * | 6/1992 | Kaneaki et al. | 341/77 |
| 5,153,593 | A * | 10/1992 | Walden et al. | 341/143 |
| 5,274,374 | A * | 12/1993 | Powell et al. | 341/143 |
| 5,416,483 | A * | 5/1995 | Matsuya | 341/143 |
| 5,500,645 | A * | 3/1996 | Ribner et al. | 341/143 |
| 6,300,890 | B1 * | 10/2001 | Okuda et al. | 341/143 |
| 6,323,794 | B1 * | 11/2001 | Okuda et al. | 341/143 |
| 6,496,128 | B2 * | 12/2002 | Wiesbauer et al. | 341/143 |
| 6,518,904 | B1 * | 2/2003 | Jelonnek | 341/143 |
| 6,538,589 | B2 * | 3/2003 | Okuda et al. | 341/143 |
| 6,873,281 | B1 * | 3/2005 | Esterberg et al. | 341/163 |
| 7,084,797 | B2 * | 8/2006 | Yokoyama et al. | 341/143 |

OTHER PUBLICATIONS

A. Maloberti, "High-seepd data converters for communication systems," IEEE Circuits Syst. Mag., vol. 1, pp. 26-36, First Quarter 2001.

P. Malcovati, et al., "Behavioral modeling of switched-capacitor sigma-delta modulators", IEEE Trans. Circuits Syst. I, Fundam. Theory Appl., vol. 50, pp. 352-364, Mar. 2003.

J: Riuz-Amaya et al., "High-level synthesis of switched-capacitor, switched-current . . . ," IEEE Trans. Circuits Syst. I, Reg. Papers, vol. 52, pp. 1795-1810, Sep. 2005.

F. Colodro, et al., "Time interleaved multirate sigma-delta modulators," in Proc. IEEE ISCAS, 2005, pp. 5581-5584.

G: Bernardinis, et al., "A wide-band 280-MHz four-path time-interleaved bandpass sigma-delta . . . ", IEEE Trans. Circuits Syst. I, Reg. Papers, vol. 53, pp. 1423-1432, Jul. 2006.

(Continued)

*Primary Examiner*—Khai M Nguyen
(74) *Attorney, Agent, or Firm*—Patent Department Infineon Technologies (57) ABSTRACT

Sigma-delta modulators and a method of modulating are disclosed in which a first sigma-delta modulator having a first quantizer is provided, and a second quantizer is also provided. At least a first node of the first sigma-delta modulator upstream of the first quantizer and a second node of the first sigma-delta modulator upstream of the first quantizer to the second quantizer are coupled together.

29 Claims, 8 Drawing Sheets

OTHER PUBLICATIONS

T.C. Caldwell, et al., "A time-interleaved continuous-time sigma-delta modulator with 20 MHz signal bandwidth," IEEE J. Solid-State Circuits, vol. 41, pp. 1578-1588, Jul. 2006.

F. Colodro, et al., "Multirate sigma-delta modulators," IEEE Trans. Circuits Syst. II, Analog Digit. Signal Process., vol. 49, pp. 170-176, Mar. 2002.

F. Colodro, et al., "New multirate bandpass sigma-delta modulators," IEEE Trans. Circuits Syst. I, Reg. Papres, vol. 51, pp. 2141-2147, Nov. 2004.

M. Yavari, et al., "Double-sampling single-loop sigma-delta modulator topologies for . . . ," IEEE Trans. Circuits Syst. II, Exp. Briefs, vol. 53, pp. 314-318, Apr. 2006.

P. Rombouts, et al., "Systematic design of double-sampling sigma-delta A/D converters with . . . ," IEEE TRans. Circuits Syst. II, Exp. Briefs, vol. 51, pp. 675-679, Dec. 2004.

J. Paramesh, et al., "An 11-bit 330MHz 8× OSR sigma-delta modulator for next-generation WLAN," in Proc. IEEE VLSI, 2006.

L. A. Williams, et al., "Third-order cascaded sigma-delta modulators," IEEE Trans. Circuits Syst., vol. 38, pp. 489-498, May 1991.

L.J. Breems, et al. "A cascaded continuous-time sigma-delta modulator with 67-dB dynamic range in 10MHz . . . ," IEEE J. Solid-State Circuits, vol. 39, pp. 2152-2160, Dec. 2004.

S. Rabii, et al., "A 1.8-V digital-audio sigma-delta modulator in 0.8-m CMOS," IEEE J. solid-State Circuits, vol. 32, pp. 783-796, Jun. 1997.

F. Medeiro, et. al., "A 13-bit, 2.2-MS/s, 55-mW multibit cascade sigma-delta modulator in CMOS 0.7-m single- . . . " IEEE J. Solid-State Circuits, vol. 34, pp. 748-760, Jun. 1999.

R. Del Rio, et al., "Highly linear 2.5-V CMOS sigma-deltamodulator for ADSL+," IEEE Trans. Circuits Syst. I, Reg. Papers, vol. 51, pp. 47-62, Jan. 2004.

O. Oliaei, et al., "A 5mW sigma-delta modulator with 84-dB dynamic range for GSM/EDGE," IEEE J. Solid-State Circuits, vol. 37, pp. 2-10, Jan. 2002.

A. Tabatabaei, et al., "A dual channel sigma-delta ADC with 40MHz aggregate signal bandwidth," in IEEE ISSCC Dig. Tech. Papers, Feb. 2003, pp. 66-67.

K. Vleugels, et al., "A 2.5-V sigma-delta modulator for boardband communications applications," IEEE J. Solid-State Circuits, vol. 36, pp. 1887-1899, Dec. 2001.

M. Ostmanns, et al., "A case study on a 2-1-1 cascaded continuous-time sigma-delta modulator," IEEE Trans. Circuits Syst. I, Reg. Papers, vol. 52, pp. 1515-1525, Aug. 2005.

R. Tortosa, et al., "A new high-level synthesis methodology of cascaded continuous-time . . . , " IEEE Trans. Circuits Syst. II, Exp. Briefs, vol. 53, pp. 739-743, Aug. 2006.

R. Rutten, et al., "Digital calibration of a continuous-time cascaded sigma-delta modulator based on variance derivative estimation," in Proc. IEEE ESSCIRC, 2006.

Z. Zheng, et al., "Sigma-delta modulators with interstage gain scaling," in Proc. IEEE MWSCAS, 2000, pp. 40-43.

L. Fang, et al., "A multi-bit sigma-delta modulator with interstage feedback," in Proc. IEEE ISCAS, 1998, pp. 583-586.

C.H. Su, et al., "A fourth-order cascaded sigma-delta modulator with DAC error cancellation technique," in Proc. IEEE MWSCAS, 2002. pp. 132-135.

Chon-In Lao, et al., "A novel semi-MASH sub-stage for high-order cascade sigma-delta modulators," in Proc. IEEE ISCAS, 2005, pp. 3095-3098.

R. Schreier, et al., "An empirical study of high-order single-bit delta-sigma modulators," IEEE Trans. Circuits Syst. I, Reg. Papers, vol. 51, pp. 461-466, Aug. 1993.

J. Markus, et al., "An efficient sigma-delta ADC architecture for low . . . ," IEEE Trans.Circuits Syst. II, Analog Digit. Signal Process., vol. 40, pp. 63-71, Jan. 2004.

G.J.Gomez, "A 102-dB spurious-free DR sigma-delta ADC using a dynamic dither . . . ," IEEE Trans. Circuits Syst. II, Analog Digit. Signal Process., vol. 47, pp. 531-535, Jun. 2000.

F.Medeiro, et al., "Fourth-order cascade SC sigma-delta modulators: a comparative . . . ," IEEE Trans. Circuits Syst. I, Funndam. Theory Appl., vol. 45, pp. 1041-1051, Oct. 1998.

A. Marques, et al., "Optimal parameters for sigma-delta modulator topologies," IEEE Trans. Circuits Syst. II, Analog Digit. Signal Process., vol. 45, pp. 1232-1241, Sep. 1998.

A.Gharbiya, et. al., "On the implementation of input-feedforward delta-sigma modulators," IEEE Trans. Circuits Syst. II, Exp. Briefs, vol. 53, pp. 453-457, Jun. 2006.

J.A. Cherry, et. al., "Excess loop delay in continuous-time delta-sigma . . . ," IEEE Trans. Circuits Syst. II, Analog Digit. SIgnal Process, vol. 46, pp. 376-389, Apr. 1998.

H. Aboushady, et al., "Systematic approach for discrete-time to continuous-time transformation of sigma-delta modulators," in Proc. IEEE ISCAS, 2002, pp. 229-232.

S.Loeda, et al., "On the design of high-performance wide-band cintinuous-time sigma-delta . . . ," IEEE Trans. Circuits Syst. I, Reg. Papers, vol. 53, pp. 802-810, Apr. 2006.

Y. Yi, et al., "A cascade 3-1-1 multibit sigma-delta A/D modulator with reduced sensitivity to non-idealities," in proc. IEEE ISCAS, 2005, pp. 3087-3090.

R. Schreier G. Temes. "Understanding Delta-Sigma Data-Converters," Wiley Interscience, 2005, pp. 122-137.

J. De Maeyer, et al., "Controlled behaviour of STF in CT sigma-delta modulators," Electronics Letters, vol. 41 No. 16, Aug. 2005.

* cited by examiner

SIGMA-DELTA MODULATORS

BACKGROUND

Sigma-Delta modulators are nowadays widely used, for example for A/D conversion and D/A conversion. Generally, in sigma-delta modulators an input signal is provided to a quantizer which introduces an error to the quantized output signal. In order to compensate for the error, the error is fed back, for example via a digital-to-analog converter (DAC), and subtracted from the input signal before entering the quantizer. The result of the subtraction of the error from the input signal can also be filtered to allow for a higher loop gain and thus reducing further the magnitude of the error at the output of the quantizer. This filtering may be provided in the feedback loop, the signal path or both. The order of this filter determines the order of the sigma-delta modulator. In many sigma-delta modulators, more than one feedback loop may be used.

Furthermore, in many sigma-delta modulators more than one quantizer may be provided. One example hereof is a cascaded or multistage (MASH) sigma-delta modulator, wherein at least a first sigma-delta modulator and a second sigma-delta modulator are connected by interstage connections. Roughly speaking, in the cascaded sigma-delta modulators, the error of one stage is quantized by the sigma-delta modulator of the next stage. The outputs of each stage, i.e. of each sigma-delta modulator are then combined to provide the output signal of the cascaded sigma-delta modulator in such a way that the error of the first modulator is almost completely canceled. Other examples of sigma-delta modulators comprising more than one quantizer are sigma-delta modulators wherein a sigma-delta modulator is connected to a further quantizer to provide the error of the quantizer of the sigma-delta modulator. The error of the further quantizer is not directly feed back to its input but a feedback loop is provided to feed back the error of the further quantizer to the signal path of the sigma-delta modulator. Thus, in these cascaded sigma-delta modulators, the error or the further quantizer is reintroduced to its input not by direct feedback but by feedback via the previous sigma-delta modulator. These cascaded sigma-delta modulators are sometimes referred to as quasi-stage sigma-delta modulators.

DETAILED DESCRIPTION

The following detailed description explains exemplary embodiments of the present invention. The description is not to be taken in a limiting sense, but is made only for the purpose of illustrating the general principles of embodiments of the invention.

Figure 1:
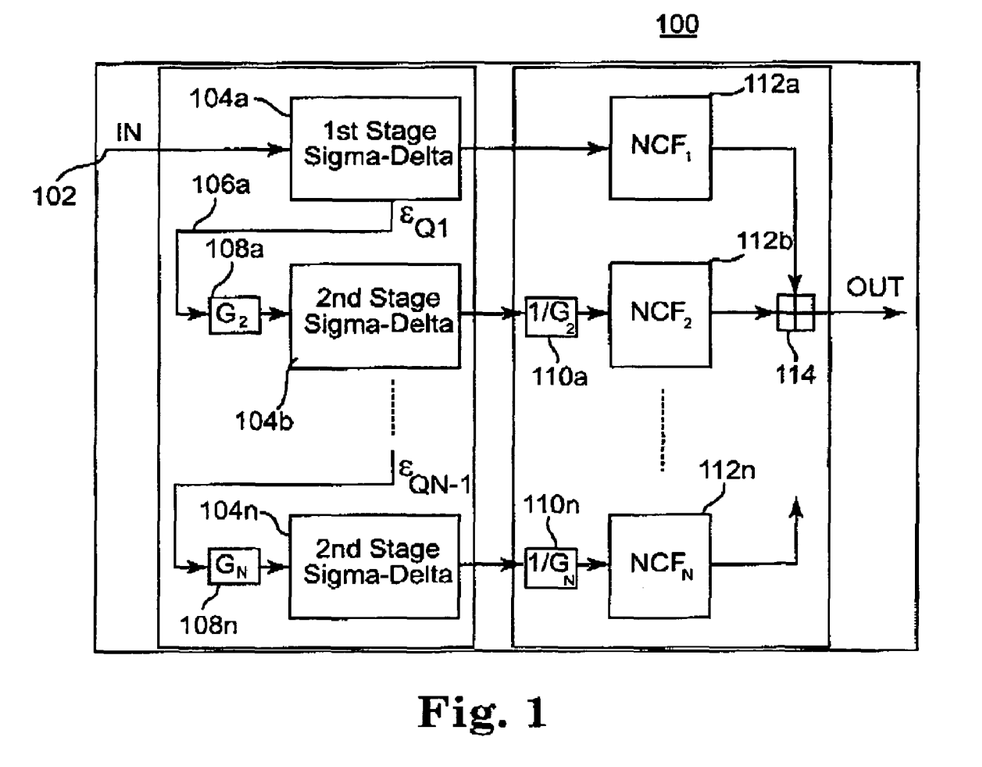
FIG. 1 shows a block diagram according to an embodiment of the present invention.

Referring to FIG. 1, a block diagram of an exemplary cascaded sigma-delta modulator 100 is shown. The cascaded sigma-delta modulator 100 comprises an input 102 connected to an input of a first sigma-delta modulator 104a representing a first stage of the cascaded sigma-delta modulator 100. A signal representing an error of the quantizer of the first sigma-delta modulator is provided via a first circuitry 106a to an input of a second sigma-delta modulator 104b. In the example shown, the cascaded sigma-delta modulator comprises n stages, i.e. sigma-delta modulators 104a . . . 104n. The term quantizer as used herein is to be interpreted broadly including A/D converters of 1 bit, 2 bit or any higher bits such as flash A/D converters, "1-bit" comparators such as Schmitt-Triggers, comparators comparing an input signal to a predetermined voltage or other devices capable of converting an analog signal into a digital signal representation. It is to be noted that by receiving an analog signal at its input, the quantizer provides at its output a quantized or digital signal with a quantization error introduced during quantization.

Each one of the following stages receives as input a signal comprising a representation of the quantization error of the previous stage. Each one of the following stages may amplify the input signal with a gain factor Gn provided by amplifiers 108a . . . 108n. Amplifying as used herein is to be interpreted broadly and may also include a gain factor of less than 1, i.e. a reduction of the signal amplitude. Furthermore, in other embodiments, no amplification may be provided in the interstage connection circuitry.

The signal is then provided to the quantizer of the sigma-delta modulator of the respective stage. The digital outputs of the stages are combined by a combining circuitry. The combining circuitry may comprise amplifiers 110a . . . 110n to amplify the output signal by a factor 1/Gn which is the inverse of the gain factors and digital noise cancellation filters 112a, 112b, . . . 112n as shown in FIG. 1. The outputs of the noise cancellation filters are provided to an adder or summing node 114 configured for combining the respective digital outputs of the stages. It is to be noted that the above described cascaded sigma-delta modulator may comprise discrete-time sigma-delta modulators or continuous-time sigma-delta modulators or a combination of these.

As described above, the input signal to each of the plurality of sigma-delta modulators comprises a representation related to the quantization error of the previous stage. According to embodiments, the input signal provided to the $2^{nd}$ and higher stages from the respective previous stage may however comprise in addition to the signal component related to the quantization error of the previous stage to some extent other signal components, for example signal components related to the input signal. According to embodiments, the signal components provided to the next stage are determined by a combination of signals tapped in the signal path of the respective stage at nodes or circuit points only upstream of the quantizer of the respective stage as will be described in more detail set forth below. The upstream direction in a sigma-delta converter as used in this application represents hereby the direction in the signal path from the output to the input of the sigma-delta converter i.e. the opposite direction in which the signal is processed in the signal path.

According to embodiments, the interstage connection circuitry may be coupled to the previous stage only at nodes in the signal path upstream of the quantizer of the sigma-delta modulator. In other embodiments, the interstage connection circuitry may be coupled to two or more nodes upstream of the quantizer and one or more nodes downstream of the quantizer. By combining signals tapped at the nodes, the signal component or the input signal may be eliminated or attenuated in the combined signal provided by the interstage connection circuitry to the next stage.

An exemplary embodiment of coupling the interstage connection circuitry to nodes in the signal path of previously stages will be described with respect to FIG. 2.

Figure 2:
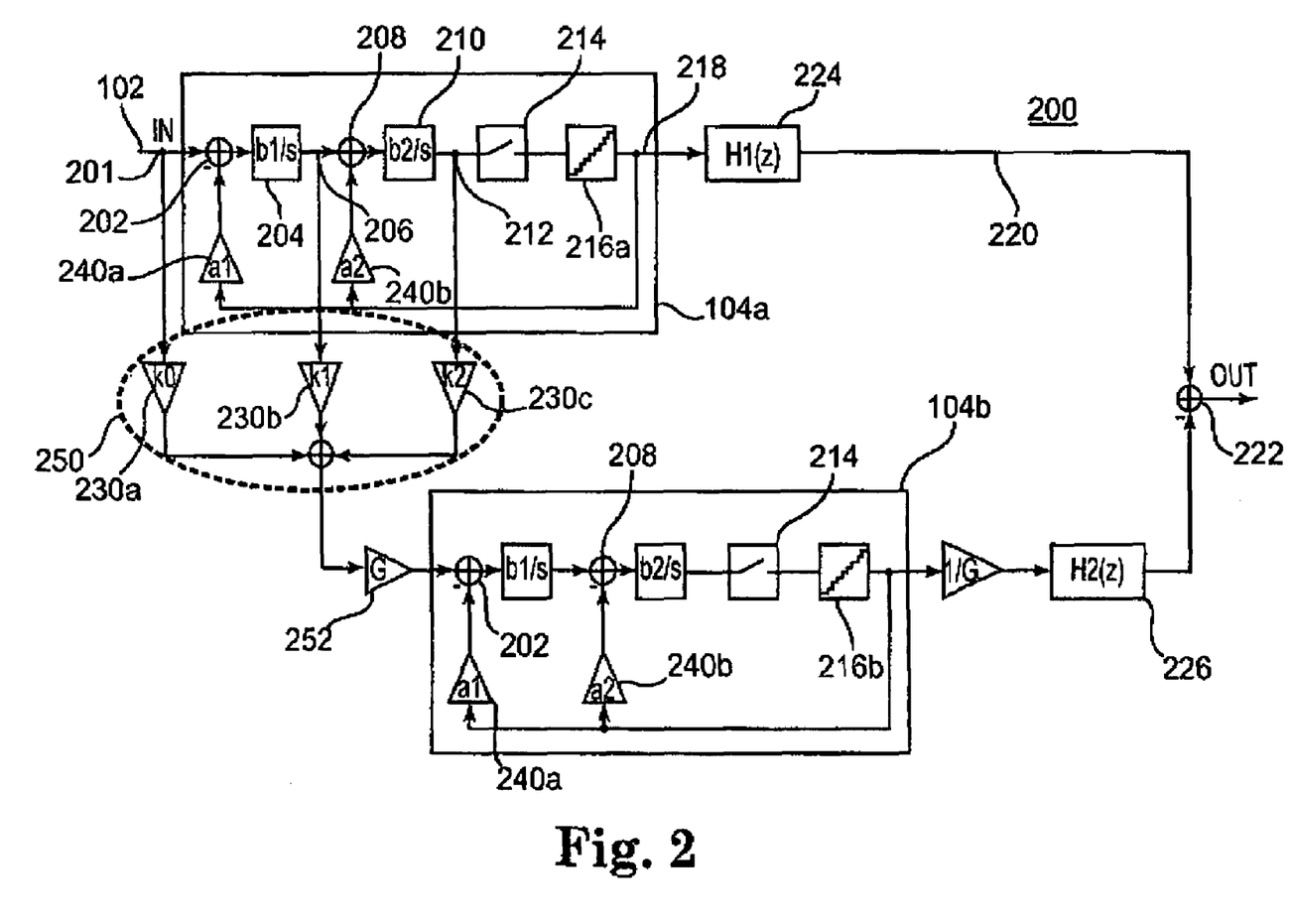
FIG. 2 shows a block diagram according to an embodiment of the present invention.

FIG. 2 shows a cascaded sigma-delta modulator 200 comprising two sigma-delta modulators 104a and 104b arranged in a cascade and representing a first and second stage of the cascaded sigma-delta modulator 200. The sigma-delta modulators 104a and 104b are in this embodiment each of the order 2, i.e. each of the loop-filters in the modulators comprises 2 integrators, however other embodiments may provide sigma-delta modulators with different order.

The input 102 of the modulator 200 is connected to an input 201 of the first sigma-delta modulator 104a which is connected to a first summing node 202 provided to feed back the reverse signal of the first feedback path to the signal path. Summing node 202 may for example be implemented by a difference amplifier or an operational amplifier having an inverting and non-inverting input. In the signal path, the summing node 202 is connected to a first integrator 204. A second summing node 208 downstream of the integrator 204 is provided in the signal path for combining the feedback of the second feedback path with the signal path, i.e. to feed back the reverse of the signal of the second feedback path in the signal path. As shown in FIG. 2, the signals in the first and second feedback paths may be scaled according to predetermined feedback coefficients. To this end, the first and second signal paths comprise feedback scaling elements 240a, 240b, for example amplifiers or passive elements, to scale the feedback signals according to predetermined feedback gains. It is to be noted that according to other embodiments, one or more of the feedback paths may not comprise feedback scaling elements.

The output of the summing node 208 is connected to a second integrator 210. The output of the second integrator 210 is connected to a sampler 214 for sampling the signal at predetermined time intervals which may be determined by the over-sampling rate (OSR) of the modulator. Since the sampler 214 is provided directly upstream of the quantizer 216a, the sigma-delta modulators are of the continuous-time type. It is however to be noted that the sampler 214 may be provided according to other embodiments directly after the input of each modulator thereby representing a discrete-time modulator. Furthermore, combinations of continuous-time and discrete-time modulators may be provided in the cascaded sigma-delta modulator according to embodiments. For example, the first modulator 104a may be a continuous-time modulator while the second modulator 104b may be a discrete-time modulator.

The output of the sampler 214 is connected to a quantizer 216a quantizing the signal provided to the quantizer 216a. The output of the quantizer 216a is connected to an output node 218. The output node 218 is connected to the feedback paths of the sigma-delta modulator to feed back the quantization error to the signal path via summing nodes 202 and 208. In the system according to FIG. 2, the first feedback path comprises a first amplifier 240a to amplify the feedback signal by a first gain a1, whereas the second feedback path comprises a second amplifier 240b to amplify the second feedback signal with a second gain a2. It is to be noted that gains a1 and a2 may be equal or smaller than 1 and the amplifiers may be replaced by omitted or passive components to allow reduction of the signals corresponding to the gains a1 and a2.

The second modulator 104b has a topology similar to the first modulator 104a as described above and will therefore not be described in more detail. Reference is made to the above detailed description of modulator 104a. It is to be noted that in the figures, a quantizer of the second modulator 104b has been denoted by reference sign 216b. It is further to be noted that in other embodiments, the sigma-delta modulators may be provided different from each other, for example with different topology or different orders.

The outputs of the first and second sigma-delta modulator are connected to a circuitry 220 having a summing node 222 to combine the output signals and to provide the combined signal to an output of the cascaded sigma-delta converter. In specific, a first noise cancellation filter 224 is connected between the output of the first sigma-delta modulator and a second noise cancellation filter 226 is connected between the output of the second sigma-delta modulator and the summing node 222. The noise cancellation filters are digital filters provided to remove the quantization error from the first stage.

Distinguished from the second modulator 104b, the first modulator 104a comprises nodes to provide signal components related to the quantization error of the quantizer 216a to the quantizer 216b of the second sigma-delta modulator 104b in order to quantize the error signal of the previous stage. According to embodiments, the signals tapped at each of the nodes are combined to remove or attenuate in the combined signal, signal components of the input signal 102 provided at the input 201. In other words, while at each node in the signal path of the sigma-delta modulator 104a the signal component of the input signal 102 is present and higher than the signal component related to the quantization error introduced in the signal path via the first and second feedback paths, by combining the signals tapped at the nodes, the signal component of the input signal 102 can be eliminated or reduced to such an extent that the sigma-delta modulator of the next stage, i.e. sigma-delta modulator 104b, is not overloaded with the remaining non-quantization error component. Thus, a higher interstage-gain may be used.

The combination of the signals may be linear or nonlinear. In a linear combination, weighting coefficients (scaling coefficients) may be used. The weighting coefficients may be frequency-independent or frequency-dependent.

In the embodiment according to FIG. 2, a linear combining with weighting coefficients is implemented. To this end, the first modulator 104a is connected via 3 nodes provided upstream of the quantizer 216a (to the second modulator. The first node 201 represents the input of the first sigma-delta modulator, a second node 206 is provided between the first integrator 204 and the second summing node 208 and a third node 212 is provided between the second integrator 210 and the sampler 214.

Each of the nodes 201, 206 and 212 is connected to a combining entity 250 for combining the signals tapped at the nodes 201, 206 and 212. In the embodiment according to FIG. 2, the combining entity is a linear combining entity providing respective scaling elements 230a, 230b and 230c for each of the nodes. Scaling elements 230a . . . 230c may for example be implemented by variable-gain amplifiers or programmable-gain amplifiers. In other embodiments, the scaling elements 230a . . . 230c may be implemented by passive elements such as a resistor network, a capacitor network or a combined resistor-capacitor network.

The output of the combining entity 250 is connected to an amplifier 252 to provide interstage gain amplification of the signal.

In the embodiment according to FIG. 2, all of the signals provided to the interstage connection circuitry are tapped upstream of the quantizer, i.e. in the analog regime of the signal path. Thus, no A/D converter is required for feeding the signal to the input of the second stage making implementation of the interstage connection circuitry easier and reducing power consumption and chip area. It is to be noted, that according to embodiments, in addition to the signals tapped at nodes upstream of the quantizer, a further signal tapped at a node downstream of the quantizer may be combined after a D/A conversion with the signals tapped upstream of the quantizer in order to provide the signal to the interstage connection circuitry.

Furthermore, while the embodiment according to FIG. 2 shows a cascaded modulator having two stages, other embodiments may in a similar manner comprise more than two stages. In addition, while the sigma-delta modulators according to FIG. 2 are $2^{nd}$ order sigma-delta modulators, it is to be noted that other sigma-delta modulators of the first order or orders higher than 2 or combinations of sigma-delta modulators having different orders may be implemented according to embodiments of the present invention.

Furthermore, while the embodiment according to FIG. 2 shows only a feed-forward circuitry from the previous stage to the next stage, other embodiments may comprise both, a feed-forward circuitry between the stages and a feedback circuitry between the stages.

Furthermore, while the feedback circuit may provide signals related to the quantization error of the quantizer of the second stage back to the first stage, it is to be noted that the feedback circuitry may be implemented similar to the feed-forward circuitry shown in FIG. 2. Thus, in this embodiment, the second stage, i.e. the second sigma-delta modulator comprises a plurality of nodes upstream of the quantizer of the second stage for feeding back to the first stage a signal related to the error of the quantizer of the second stage. According to embodiments, a first interstage connection circuitry between a first and second stage may comprise only feed-forward circuitry while a further interstage connection circuitry may comprise only feedforward circuitry.

Figure 3:
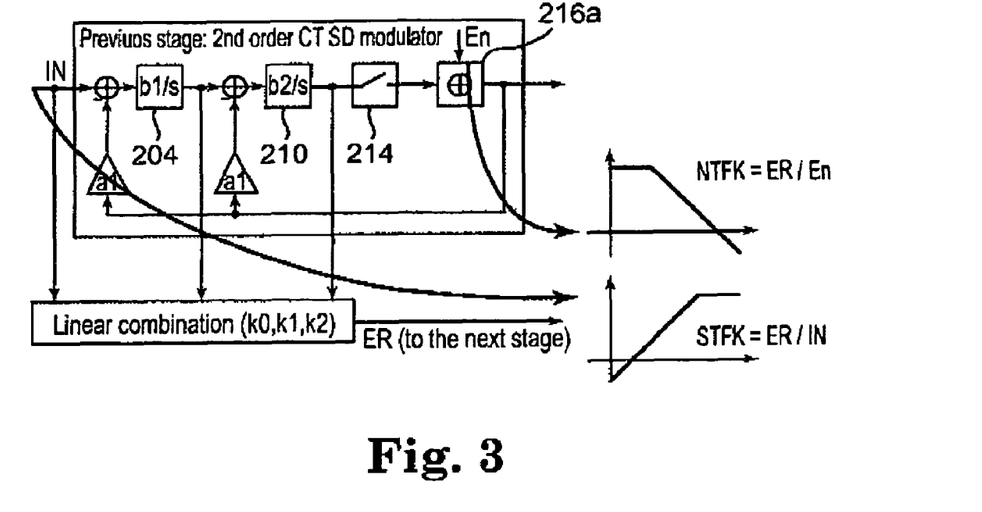
FIG. 3 shows a block diagram according to an embodiment of the present invention.

For determining the scaling coefficients k0 . . . k2 of the scaling elements, a linear model may be used as shown in FIG. 3. In embodiments, the scaling coefficients k0 . . . k2 may be determined to provide a high-pass filtering of the input signal IN and a low-pass filtering of the quantization error En introduced by the quantizer 216a which is shown in FIG. 3 by an interstage noise transfer function NTFK having a low-pass characteristic and an interstage signal transfer function STFK having a high-pass characteristic. In other embodiments, the coefficients may be selected to provide an all-pass filtering characteristic of the quantization error.

According to one embodiment, the interstage signal may be provided by $$ER = k0 \cdot IN + k1 \cdot x1 + k2 \cdot x2$$

with x1 and x2 being the state variables at the nodes 206 and 212.

The state variables x1 and x2 may be assumed to be $$x1 = (IN \cdot b1 \cdot (b2 \cdot a2 + s) - En \cdot b1 \cdot a1 \cdot s) / (s^2 + s \cdot b2 \cdot a1 \cdot b2)$$

$$x2 = (IN \cdot b1 \cdot b2 - En\ b2 \cdot (b1 \cdot a1 \cdot a2 \cdot s)) / (s^2 + s \cdot b2 \cdot a1 \cdot b2)$$

where IN is the input signal and En is the quantization error.

The denominator $s^2 + s \cdot b2 \cdot a2 + b1 \cdot a1 \cdot b2$ is selected to provide two poles far from the bandwidth of interest.

The zeros of the interstage transfer functions STFK=ER/IN and NTFK=ER/En are given by numerator of ER/IN=k0·$s^2$+(k1·b1+k0·b2·a2)·s+k0·b1·a1·b2+k2·b2·b1+k1·b1·b2·a2 and numerator of ER/En=(k1·b1·a1+k2·b2·a2)·s+k2·b2·b1·a1.

The scaling coefficients are now determined by implying high-pass characteristica to ER/IN inside the bandwidth of interest and low-pass characteristica to ER/En. The ER/En zero is then placed outside of this frequency band and the two zeros of ER/IN are provided close to DC. According to other embodiments, the coefficient k0 may be selected to be zero resulting in only one zero of ER/IN.

According to one embodiment, the coefficients may be selected as k0=0, k1=1/b2, k2=−1 resulting in:

numerator: of ER/En=(b1/b2·a1−b2·a2)·s−b1·b2·a1 numerator of ER/IN=b1/b2·s−b2·b1+b1·a2

For an exemplary modulator with b1=1, b2=1, a1=1, a2=1.5, the above coefficients k0=0, k1=1/b2 and k2=−1 result in a zero for ER/En outside the signal bandwidth and at 4 times the frequency of the zero of ER/IN located inside the bandwidth.

It is to be noted, that according to other embodiments other coefficients may be provided, for example k0=0, k1=1 and k2=−1.

A circuit diagram of an exemplary implementation of the sigma-delta modulator according to FIG. 2 will now be described with respect to FIG. 4.

Figure 4:
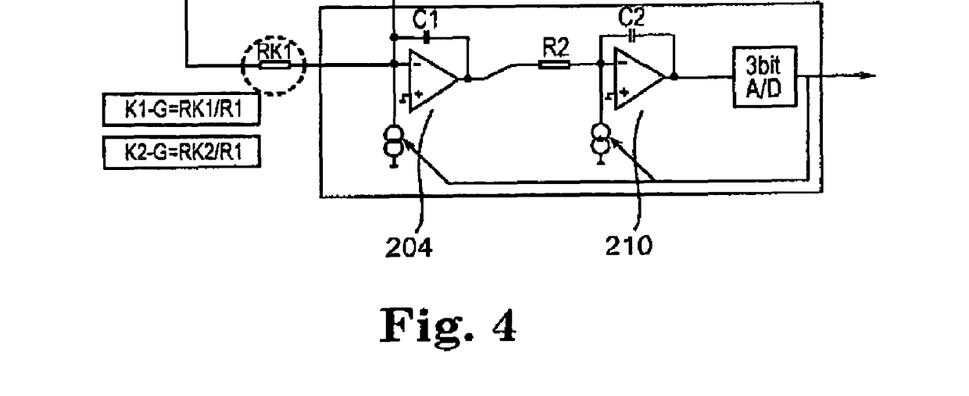
FIG. 4 shows a block diagram according to an embodiment of the present invention.

The sigma-delta modulator according to FIG. 4 is implemented as single-ended circuit. In other embodiments, the sigma-delta modulator may be implemented as differential circuit. In the sigma-delta modulator according to FIG. 4, the scaling elements are implemented as resistors Rk1 and Rk2 resulting in a non-complex, low-power, low-area sigma-delta modulator. As can be seen in FIG. 4, the quantizer is implemented in this embodiment as a 3 bit flash A/D converter. The integrators 204 and 210 are implemented as OpAmps with a capacitive feedback loop.

Figure 5:
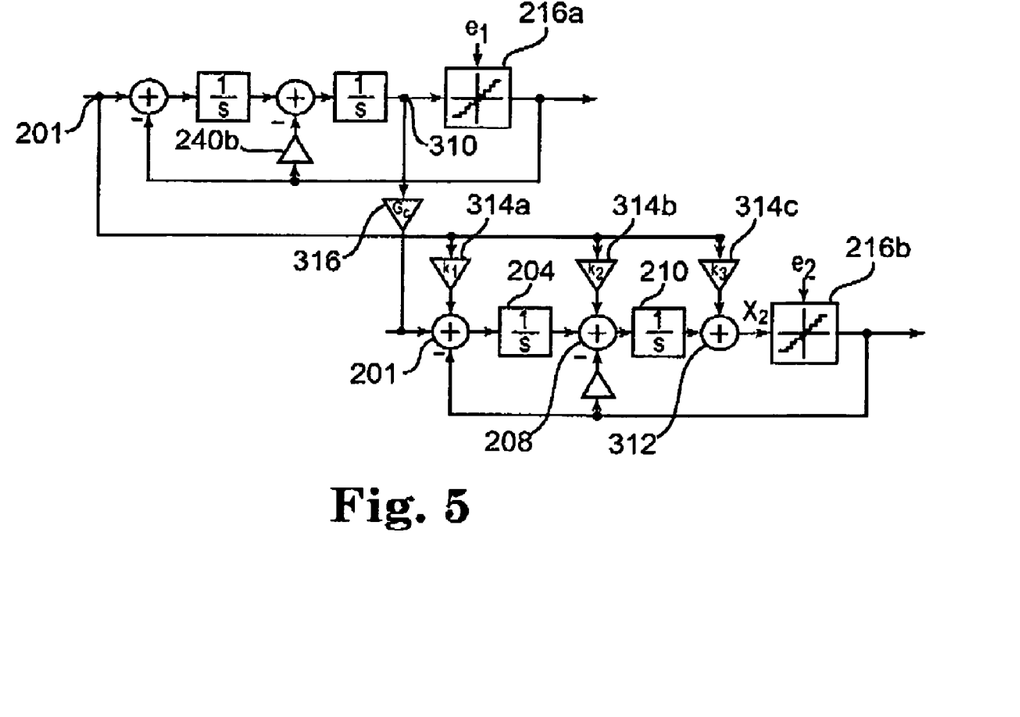
FIG. 5 shows a block diagram according to an embodiment of the present invention.

While in the embodiment according to FIGS. 2 to 4 the interstage connection circuitry is coupled only to the input of the second stage, FIG. 5 shows now an exemplary embodiment implementing a coupling of the interstage connection circuitry to more than one nodes or circuit points of the second stage.

According to FIG. 5, the signal component related to the quantization error is provided to the second stage by tapping signals at the input 201 of the first stage and at a node 310 representing an input of the quantizer 216a. While in FIG. 5 the sampler 214 is not shown, it is to be noted that in a continuous-time implementation, sampler 214 may be provided directly upstream of the quantizer 216a. In this implementation, node 310 may correspond to node 212 shown in FIG. 2.

The input node 201 is coupled via the interstage connection circuitry to three nodes in the signal path of the second stage. In particular, the input node 201 is coupled to the summing node 202 representing the first feedback node for feeding the quantization error back to the signal path. Furthermore, the node 201 is coupled to the summing node 208 of the second stage representing the second feedback node of the second stage. The node 201 is further coupled to a third summing node 312 provided between the second integrator 210 and the quantizer 216a.

According to the embodiment of FIG. 5, each of the signals provided to the summing nodes 201, 208, 312 is scaled by a respective weighting coefficient prior to providing same to the respective nodes. The weighting coefficients may be fixed weighting coefficients or frequency dependent. Furthermore, according to embodiments, the plurality of weighting coefficients may comprise fixed and frequency dependent weighting coefficients, for example one or more of the weighting coefficients related to one or more nodes may be fixed while the other weighting coefficients related to the other nodes may be frequency dependent.

To provide the scaling of the respective signals according to the weighting coefficients k1 . . . k3, scaling elements 314a, 314b and 314c are implemented. It is to be noted that according to other embodiments, scaling of one or more of the signals may not be provided. Scaling elements 314a . . . 314c may be implemented by active and/or passive elements. According to one embodiment, the scaling elements are provided only by passive elements providing easy implementation and reduced power consumption. For example, by implementing the first scaling element 314a as a resistor and the second and third scaling elements 314b and 314c as capacitors, the interstage signal provided to the second stage may be high-pass shaped. Scaling coefficients of more than unity may be achieved by providing an amplifier prior to the scaling elements 314a . . . 314c.

As can be seen in FIG. 5, the signal tapped at node 310 is provided by the interstage connection circuitry to the summing node 201. Prior to providing the signal to the summing node 201, the signal is scaled with an interstage gain Gc. To this end, a scaling element or amplifier 316 is provided.

While the combining circuitry to combine the outputs of the first and second stages is not shown in FIG. 5, it is to be noted that the output signals may be combined by a circuitry similar to the circuitry shown in FIG. 2.

In the embodiment according to FIG. 5, only one of the feedback paths, i.e. the second feedback path comprises a scaling element 240b. However, in other embodiments, both feedback paths may comprise scaling elements respectively.

Figure 6:
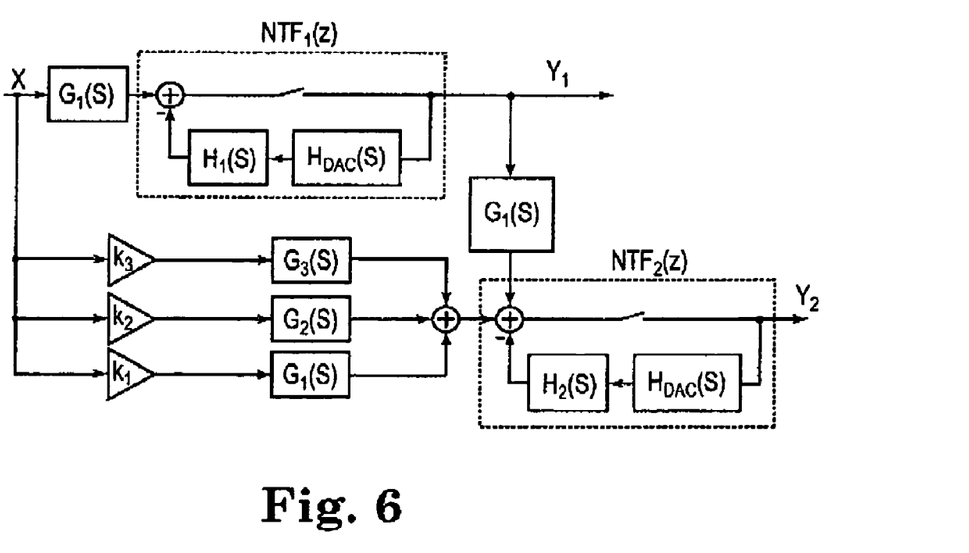
FIG. 6 shows a block diagram according to an embodiment of the present invention

By selecting the weighting coefficients of the scaling elements 314a, 314b and 314c, the component related to the input signal IN of the cascaded sigma-delta modulator may be removed or attenuated. According to one embodiment, in order to remove the input signals in the second stage, the overload transfer function $F_{OV}(s)=X_2(s)/X(s)$ being the ratio of the signal provided to the second quantizer and the input signal IN of the cascaded sigma-delta converter is minimized. FIG. 6 provides an approximated linear model which may be used to calculate the respective scaling parameters k1 . . . k3 assigned.

The linear model considers the loopfilter functions H1(s) and H1(s), the DAC converter function HDAC(s) and the filter characteristics G1(s), G2(s) and G3(s) for the input filter. The noise transfer function NTF(z) may be calculated by using the impulse invariant transform with a rectangular DAC pulse (DAC=digital-to-analog conversion). Since the noise transfer function NTF is defined in the discrete-time, the bilinear transformation is applied to obtain a continuous-time transfer function.

The functions of the input filters depend on the location where the input signals is introduced in the sigma-delta modulator. For inputting the signal at the input of the sigma-delta modulator, the input filter function G1(s) is obtained by multiplying the characteristics of the two loop-filters thereby obtaining $G1(s)=1/s^2$. In a similar manner, the functions for the second input filter is obtained to be equal to the second loopfilter function, i.e. G2(s)=1/s and the third input filter has no filter characteristic, as no filters are provided between in the path from node 201 to node 312, i.e. G3(s)=1.

The overload function is then obtained as $$F_{ov}(s) = NTF_2(z)\left(G_1^2(s)NTF_1(z) + \sum_{i=1}^{3} k_i G_i(s)\right)_{Z=\frac{1+s/2}{1-s/2}}$$

The overload transfer function may be written as $$F_{ov}(s) = \frac{a_0 + a_1 s^1 + \ldots + a_N s^N}{b_0 + b_1 s^1 + \ldots + a_N s^N}$$

where N is the order of the cascaded continuous-time sigma-delta modulator. For obtaining a high pass transfer function, the a0 . . . a2 are set to zero. By imposing this condition, the weighting coefficients k1 . . . k3 can be calculated.

For the topology shown in FIG. 5, coefficients of [k1, k2, k3]=[−1, 1, −12/16] are obtained by using the above linear model. By using an optimization method, the k1 . . . k3 are obtained to [k1, k2, k3]=[−0.998, 0.930, −0.704] showing no significant difference to the analytical solution.

It is to be noted at this point, that besides the above values of k1 . . . k3 other values may be used in other embodiments since the more than one interstage signal paths from the previous to the next stage allows a high degree of freedom for selecting the coefficients.

While the above embodiments have been described with respect to cascaded sigma-delta modulators, it is to be understood that other embodiments may include other sigma-delta modulators comprising 2 or more quantizers, for example quasi-stage sigma-delta modulators.

Furthermore, while the embodiments shown in FIGS. 2 to 6 are related to implementations of a multi-node interstage circuitry in a feedforward path, it is to be noted that according to other embodiments the multi-node circuitry may also be provided in a feedback path to provide the error signal of the second stage to the signal path of the first stage.

In the following further embodiments will be explained related to the design of sigma-delta modulators with interstage circuitry. To be more specific, in embodiments as set forth below, a design of cascaded sigma-delta modulators is provided to implement a zero or nearly a zero in the global noise transfer function by selecting a scaling factor in the interstage feedback loop between two stages. According to other embodiments, the exemplary sigma-delta modulators as set forth below may be adjusted to increase the bandwidth of the sigma-delta modulators.

Figure 7:
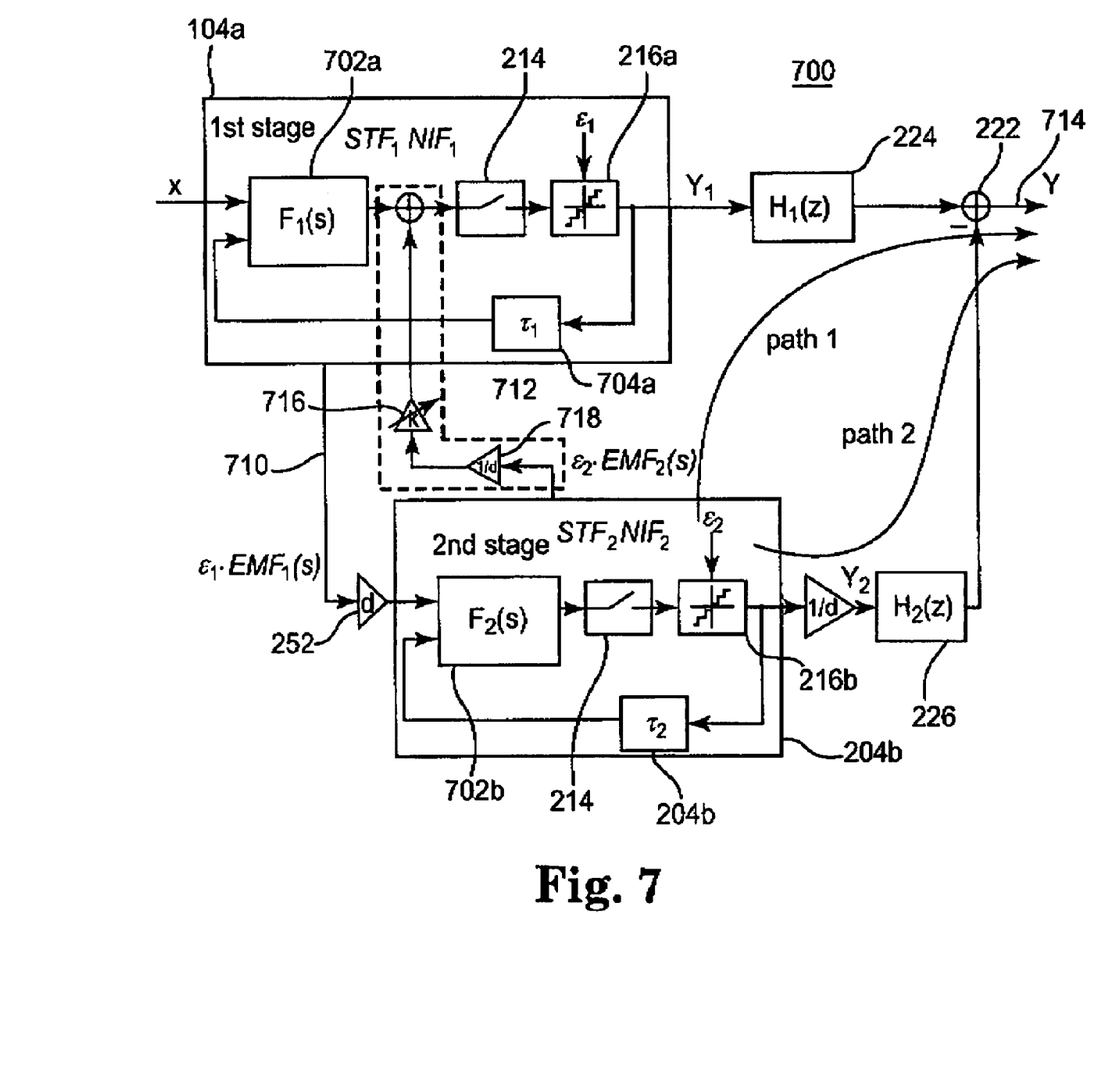
FIG. 7 shows a block diagram according to an embodiment of the present invention.

FIG. 7 shows an exemplary embodiment of a cascaded sigma-delta modulator 700. The cascaded sigma-delta modulators comprises two stages implemented by the two sigma-delta modulators 104a and 104b.

The sigma-delta modulator 104a comprises a filter 702a and a feedback delay element 704a while the sigma-delta modulator 104b comprises a filter 702b and a feedback delay element 704b. The sigma-delta modulators may be of order n, where the order n is determined by the filter functions F1 and F2 of the filters 702a and 702b, respectively. While the sigma-delta modulators shown in FIG. 7 comprise the sampler directly upstream of the quantizers 216a and 216b respectively, therefore representing a continuous-time sigma-delta modulator, it is to be noted that other embodiments may implement the cascaded sigma-delta modulator as discrete-time sigma-delta modulator.

The cascaded sigma-delta modulator 700 comprises an interstage feedforward path 710 to feed an error of the quantizer 216a of the first stage to the second stage and an interstage feedback path 712 to feed back to the first stage the error from the quantizer 216b of the second stage.

The interstage feedforward path 710 may be implemented in accordance with the embodiments shown in FIGS. 2 to 6. However, the interstage feedforward path 710 may also be provided without the multi-node connection as described in FIGS. 2 to 6. For example, the interstage feedforward path 710 may be connected to the first stage only at a first node upstream of the quantizer and a second node downstream of the quantizer in order to provide an error signal to the second stage. In addition, the interstage feedback path 712 may be implemented in accordance with the multi-node connection shown in FIGS. 2 to 6 or without the multi-node connection.

By implementing the interstage feedback path 712, two signal paths for the error e2 of the quantizer of the second stage to the output 714 of the sigma-delta modulator are provided as is schematically shown in FIG. 7. A first path, denoted in FIG. 7 as path 1, feeds the error e2 via the feedback path 712 to the signal path of the first stage. From the signal path of the first stage, the error signal is then quantized by quantizer 216a and provided to the first noise cancellation filter 224 and to the output 714 of the cascaded sigma-delta modulator 700.

The second path, denoted in FIG. 7 as path 2, is provided by feeding the output signal of the second sigma-delta modulator containing the error signal e2 via the second noise cancellation filter 226 to the summing node 222.

As can be seen in FIG. 7, the interstage feedback path comprises a scaling element 716 scaling the feedback signal with a scaling factor K. It is to be noted that in FIG. 7 the interstage feedback path 712 comprises in addition a scaling element 718 halving a scaling factor equal to the inverse of the interstage gain d provided in the interstage feed-forward path by scaling element 252 in order to rescale the error when feeding back to the first stage. Although FIG. 7 shows two separate scaling elements 716 and 718, it is to be understood that in other embodiments, for example the embodiments according to FIGS. 8, 9 and 10, the scaling elements 716 and 718 may be replaced by only a single scaling element having the scaling factor or interstage gain K/d.

As will be explained in the following, the scaling factor k can be determined to provide a zero of the global noise transfer function or can be determined to provide an increased bandwidth.

In order to determine the scaling factor k in the interstage feedback path, a linear analysis of the system will be provided for better understanding.

The output signal Y at the output 714 is determined by the two signals Y1 and Y2 combined at summing node 222, $$Y = Y1 \cdot H1 - Y2 \cdot H2$$

Taking into account the feedforward and feedback paths, the output signal is obtained according to $$Y = [xSTF1 + e1 \cdot NTF1 + e2 \cdot k \cdot NTF1 \cdot EMF2] \cdot H1 - [e1 \cdot EMF1 \cdot STF2 + e2 \cdot NTF2] \cdot H2$$

with STF1, STF2 being the signal transfer functions of the first and second stages, NTF1, NTF2 being the noise transfer functions of the first and second stages, e1 and e2 being the quantization errors of the first and second stages and EMF1, EMF2 being the transfer function of the interstage feed-forward and feedback circuitry.

The noise cancellation filters characteristic are then determined to H1=EMF1·STF2 and H2=NTF1 in order to eliminate the error e1 of the quantizer of the first stage in the output signal. Thus, the output signal is $$Y = x(STF1 \cdot EMF1 \cdot STF2) + e2 (k \cdot NTF1 \cdot EMF1 \cdot EMF2 \cdot STF2 - NTF1 \cdot NTF2)$$

It can be seen that by introducing the interstage feedback loop, a term e2(k·NTF1·EMF1·EMF2·STF2) depended on the scaling factor k and on the first noise cancellation filter H1=EMF1·STF2 is added to the output signal. According to embodiments, the adding of this term is used to eliminate the error e2 in the output signal by determining the scaling factor k and thus to provide a zero or approximate zero in the global error transfer function. It is to be noted that according to the above, the zero in the global noise transfer function can be achieved without using resonators and without changing the characteristics of the noise cancellation filters and the zero can be shifted or adapted by varying the scaling factor k. Thus, according to one embodiment, since the noise cancellation functions are not changed by the trimming of the feedback gain, the noise cancellation filters can be implemented in a simple manner for example without a complex conjugate zero. This allows convenient designing of the cascaded sigma-delta modulator and a non-complex implementation.

Assuming for example for the cascaded sigma-delta modulator according to FIG. 7 values of EMF=1, STF=2, NTF1=NTF2=$(1-z^{-1})$, H1=1 and H2=$(1-z^{-1})$, the output signal may be obtained to Y=x+e2[$(-1+k)+(2-k) \cdot z^{-1} - z^{-2}$].

While the term $(-1+k)$ in the bracket is related to a noise floor, the term $[(2-k) \cdot z^{-1}]$ can be made zero to provide a zero in the noise transfer function.

In general, it can be shown that by providing the feedback path 512 for a cascaded sigma-delta modulator comprising sigma-delta modulators of order n, a noise transfer function can be provided in the z-domain according to $$NTF(z) = (1-z^{-1})^n z^{-1} \alpha + (1-z^{-1})^{n+2} \quad (1)$$

where α is proportional to the scaling factor k and n is related to the order of the cascaded sigma-delta modulator.

Equation (1) may be rewritten in the form $$NTF(z) = (1-z^{-1})^{n-1}(1-(2-\alpha)z^{-1} + z^{-2}) \quad (2)$$

In order to achieve the above noise transfer function, the location where the interstage feedback signal is introduced, i.e. the node to which the interstage feedback path is coupled to the signal path of the first sigma-delta modulator is selected for each topology of a cascaded sigma-delta modulator in order to attain the dependency provided in the above equation (1).

For example for a 2-2 cascaded sigma-delta modulator where the first and the second stage are of order 2, the interstage feedback signal may be introduced at a node directly upstream of the quantizer, i.e. at the input of the quantizer.

Figure 10:
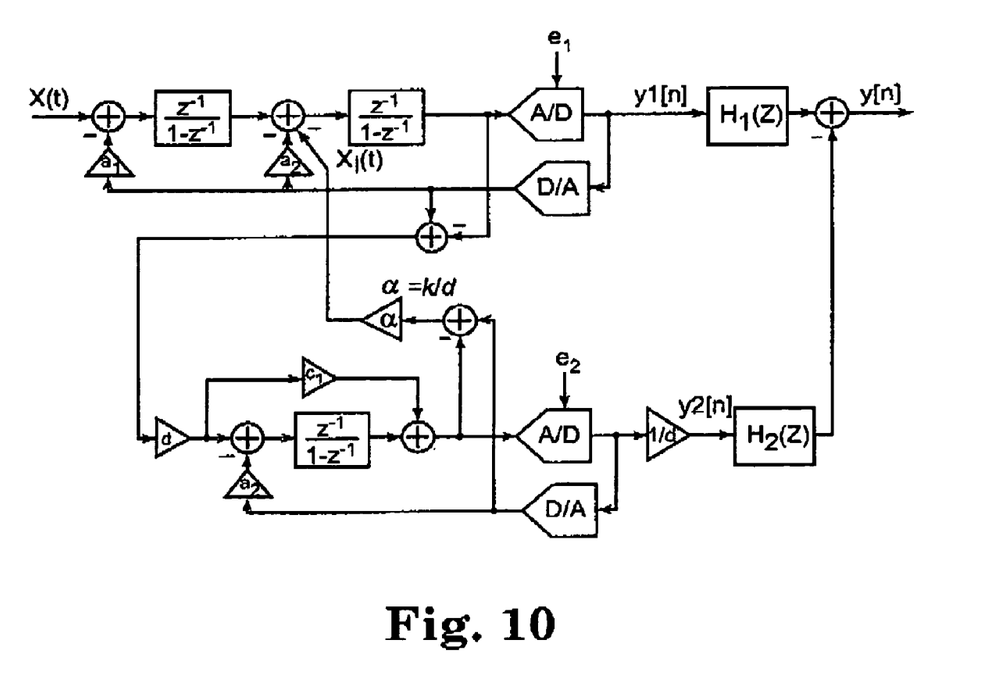
FIG. 10 shows a block diagram according to an embodiment of the present invention.

For a 2-1 cascaded sigma-delta modulator, in order to attain the dependency of equation (1) with n=1, the interstage feedback signal may be introduced at a node directly upstream of the second integrator (loop filter), i.e. at the input of the second integrator of the first stage as shown in FIG. 10 for a discrete-time cascaded 2-1 sigma delta modulator.

In order to achieve a desired location for the zeros of the global noise transfer function with increased SNR (signal-to-noise ratio), the module of the complex conjugate zeros, |Z|, is placed to be equal to unity. If the noise cancellation function H1(z) has a k2 coefficient, i.e. if H1(z)=k1·$z^{-1}$+k2·$z^{-1}$, the module of the zeros is different from unity and analysis of the k value is required to increase the SNR.

Assuming further the signal transfer function STF2 to have a second order, i.e.

$$STF2(z) = \frac{k1 \cdot z^{-1} + k2 \cdot z^{-2}}{D(z)},$$

where D(z) is equal to 1 and the interstage gain d is equal to 1, the noise transfer function NTF(z) becomes $$NTF(z) = -(1-z^{-1})^2 \cdot (1-(2-K \cdot k1)z^{-1}(1+K \cdot k2) \cdot z^{-2}) \quad (3)$$

The NTF(z) of equation (3) has two terms of noise shaping. The first term provides two zeros in DC, and the second term provides two complex conjugate zeros.

The complex conjugate zeros are obtained to $$Z = 1 - \frac{Kk1}{2} \pm j\sqrt{Kk1\left(1 - \frac{Kk1}{4}\right) + Kk2} \quad (4)$$

As can be seen from equation (4), the zeros are only related to the scaling factor K and H1(z). The module is obtained by $$|Z| = \sqrt{1 + Kk2} \quad (5)$$

Thus, the module of the complex conjugate zeros does not depend on k1. If k2≠0, the module is non-zero.

Taking K<<1, the zeros module is near to unity. The k value can then be obtained in the $\omega_z$ frequency by $$K = 2\frac{k2 + k1 f(\omega_z) \pm \sqrt{k1^2 f(\omega_z) + k2^2 + 2k1 k2 f(\omega_z)}}{k1^2 f(\omega_z)} \quad (6)$$

where f($\omega_z$)=1+tan²($\omega_z$)

Taking k1=0, the interstage feedback gain K is obtained to $$K|_{k1=0} = \frac{\tan^2(\omega_z)}{k2}$$

To find a real value of K, the relation $$k1^2 f(\omega_Z) + k2^2 + 2k1 k2 f(\omega_Z) > 0$$

has to be fulfilled.

If K<<1, the requirement is simplified to k1+k2≠0 (7).

The above condition implies that the transfer function H1(z) is low-pass. Assuming the above requirement is fulfilled, the K value according to equation (6) has two solution, where one of them is valid.

For calculating the K value, the frequency $\omega_z$ can be selected to have a high SNR ratio. Analytic calculation may be performed to provide the best choice, i.e. highest SNR for $\omega_z$.

Taking an exemplary embodiment with a fourth order, it can be shown that a highest SNR ratio is achieved when $$\omega_z \approx \frac{\sqrt{35}}{7} \frac{\pi}{OSR}$$

is fulfilled.

It can be seen that the $\omega_z$ for highest SNR is depended on the oversampling ratio OSR. Thus, the K value providing a high SNR is also dependent on the OSR.

Figure 11:
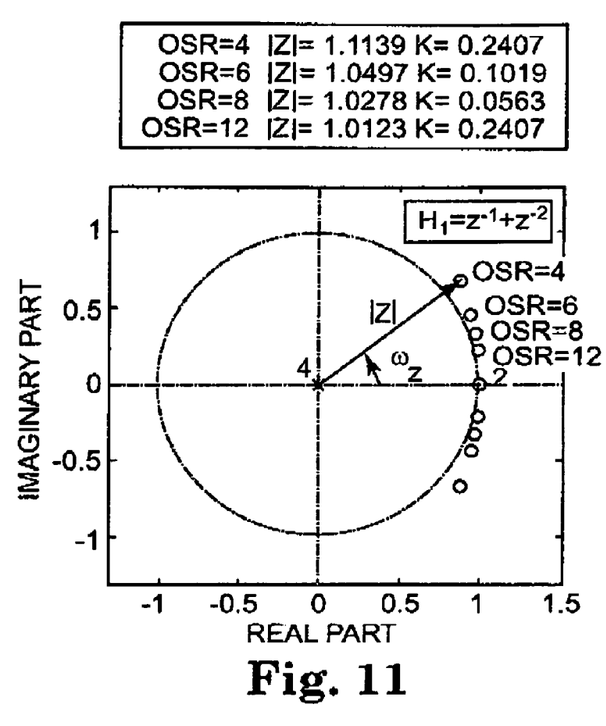
FIG. 11 shows a diagram to illustrate exemplary zero locations according to an embodiment of the present invention.

This is shown for an exemplary embodiment in FIG. 11 illustrating calculated $\omega_z$ and K values for multiple OSR ratios for an exemplary cascaded sigma-delta modulator of order 4. Furthermore, it is to be noted that the highest SNR for given OSR is dependent on the module of the zero, |Z|.

It can be shown that the relation between K, k1, k2 and |Z| can be written in the form $$k1 = -2\frac{|Z|\cos(\omega_z) - 1}{K} \text{ and } k2 = \frac{|Z|^2 - 1}{K}.$$

Dividing the two previous equations results in $$\frac{k1}{k2} = -2\frac{|Z|\cos(\omega_z) - 1}{|Z|^{-1}} \quad (8)$$

which allows to scale the modulator in order to attain the modulate of zeros, |Z|, and the zero location $\omega_Z$ desired.

In an exemplary design process according to one embodiment a cascade topology may be selected and the NTF1 of the first stage may be designed to simplify the digital noise cancellation filter having the filter function H2(z). Then, based on equation (1), the points or nodes where the interstage feedback is introduced to the first stage is selected based on the requirement to obtain a noise transfer function zero. The complex conjugate zeros module |Z| and the location of $\omega_z$ are then determined and fixed. As described above, the zeros module |Z| depends on the desired OSR and the desired SNR. The frequency for best SNR may be selected based on known analysis methods of sigma-delta modulators. The zeros module |Z| is chosen to be unity or closest to unity as possible, in order to obtain a high SNR. The modulator is then scaled until the equations (7) and (8) are fulfilled. If fulfillment of equation (8) is not possible, the |Z| requirement may be relaxed. Then, with the calculated k1 and k2, the interstage scaling factor (interstage feedback gain) K can be determined.

While in the above embodiments, the zeros of the noise transfer function have been placed to provide a highest SNR, the zeros may according to other embodiments be placed to provide an increased bandwidth, i.e. a bandwidth extension. To this end, the zeros may be placed beyond the location of highest SNR.

Figure 8:
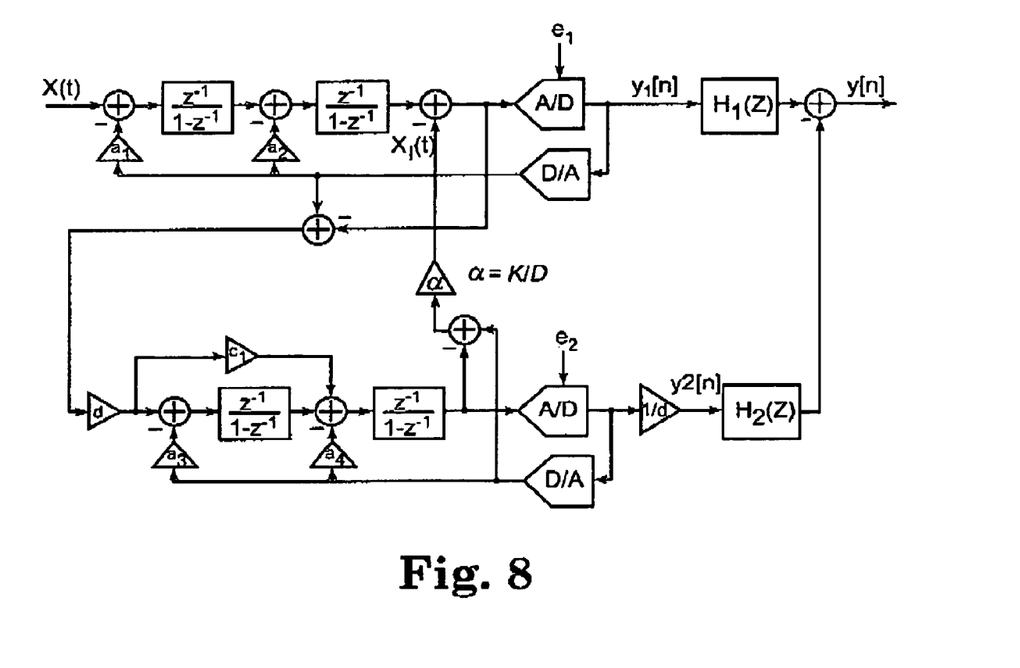
FIG. 8 shows a block diagram according to an embodiment of the present invention.
Figure 9:
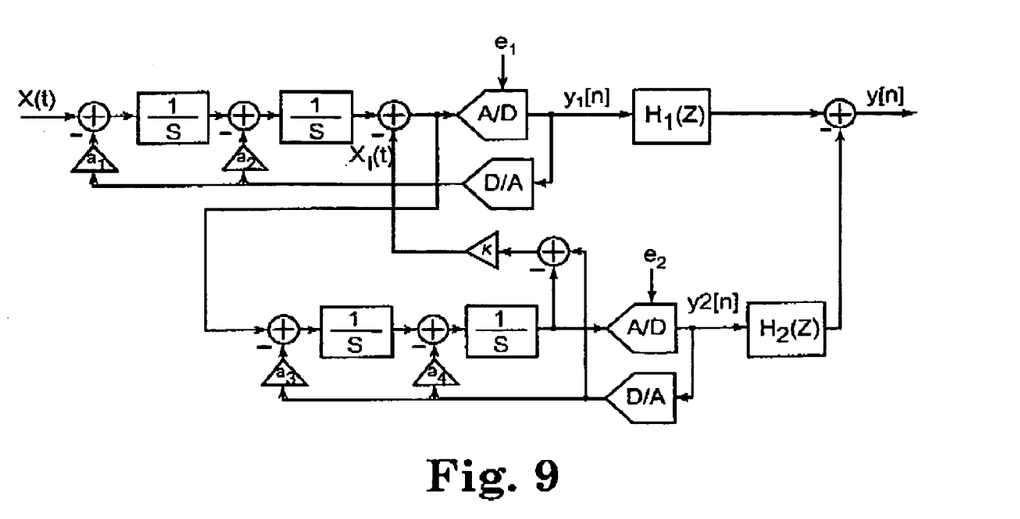
FIG. 9 shows a block diagram according to an embodiment of the present invention.
Figure 12:
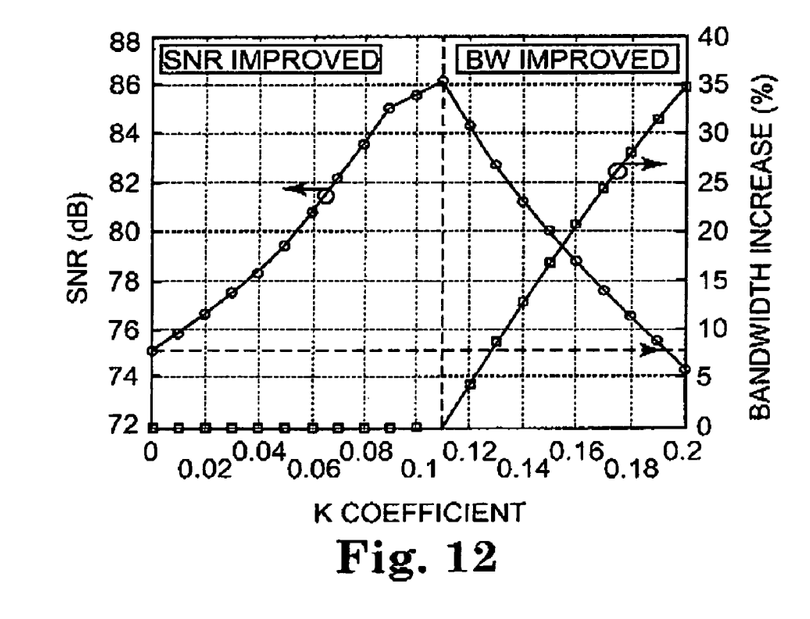
FIG. 12 shows a diagram to illustrate different operation regions according to an embodiment of the present invention.

FIG. 12 shows analysis based on the embodiment shown in FIG. 8. By varying the K value, different regions of operation can be provided. In general, the region of operation can be divided in two regions, a first region where the SNR is improved and a second region where the bandwidth is improved. As can be seen in FIG. 12, in the first region of operation, the bandwidth remains constant at the nominal value but the NTF(z) is shifted to increase the SNR by shifting K to higher values. The maximum SNR value is achieved when $K=K_{opt}$. Increasing K beyond $K_{opt}$ provides then increased bandwidth while the SNR decreases below its highest value.

Thus, according to one embodiment, by providing a variable interstage gain of variable scaling factor K, a switching between different operation modes is provided. For example, for applications requiring high SNR, the interstage scaling factor K may be provided at a first value and for applications requiring low SNR, the scaling factor may be provided at a second value. To this end, the interstage feedback circuitry may comprise variable gain elements for example a variable-gain amplifier, a variable resistor or variable resistor network, a trimming resistor, a variable capacitor, a variable capacitor network or a trimming capacitor. Variable hereby includes discrete switching between different values, for example by using fuses or switching transistors, as well as continuously varying. Variable means also that the interstage scaling factor is adjusted during manufacturing and thereafter remains reversibly or irreversibly fixed. While switching or adjusting the variable gain element may be provided during manufacturing, it is to be noted that switching or adjusting may also be provided during operation. Thus, with the above embodiments, a A/D converter or a D/A converter may be provided which can be adapted without effort to intended fields of operation. According to embodiments, the scaling factor K may be provided lower than 1. According to other embodiments, the scaling factor K may be provided lower than 0.3.

It is to be noted that the above explained cascaded sigma-delta modulators may be implemented as discrete-time modulators as well as continuous-time modulators. For continuous-time modulators, the analog transfer functions of the modulator can be matched to the digital noise cancellation filters by trimming or varying the variable interstage feedback gain thereby allowing realization of cascaded continuous-time sigma-delta modulators with high performance.

While the above exemplary embodiments have been described with respect to cascaded sigma-delta modulators wherein each stage is implemented as a "full" sigma-delta modulator, it is to be understood that in other embodiments the cascaded sigma-delta modulators may be implemented as so called quasi-stage sigma-delta modulators wherein the second stage is implemented by a quantizer and the feedback path of the second stage is provided by feeding the error signal via the interstage feedback path 712 back to the second stage.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits means. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A device comprising:
a first sigma-delta modulator comprising a first quantizer;
a second quantizer; and
circuitry to couple at least a first node of the first sigma-delta modulator upstream of the first quantizer, a second node of the first sigma-delta modulator upstream of the first quantizer and a third node of the first sigma-delta modulator upstream of the first quantizer to the second quantizer.

2. The device according to claim 1, wherein the device comprises a second sigma-delta modulator, the second sigma-delta modulator comprising the second quantizer.

3. The device according to claim 2, wherein the first sigma-delta modulator represents a second stage of a cascaded sigma-delta modulator and the second sigma-delta modulator represents a first stage of a cascaded sigma-delta modulator.

4. The device according to claim 2, wherein the circuitry is an interstage circuitry to couple a first stage and a second stage of a cascaded sigma-delta modulator, the interstage circuitry coupling only nodes upstream of the first quantizer to the second stage.

5. The device according to claim 1, wherein the first sigma-delta modulator comprises a first and second integrator, and wherein the first and second node are selected from the group comprising:
the input of the first sigma-delta modulator,
a node between the first and second integrator, and
a node between the second integrator and the quantizer.

6. The device according to claim 1, wherein the first sigma-delta modulator comprises at least a first feedback-loop and a second feedback-loop, the first feedback-loop coupling the output of the first sigma-delta modulator to a first feedback-node and the second feedback-loop coupling the output of the first sigma-delta modulator to a second feedback-node, wherein the first and second node are selected from the group comprising:
the first feedback node,
the second feedback node,
a node between the first and second feedback node,
the input, and
a node between the second feedback node and the quantizer.

7. The device according to claim 1, wherein the circuitry comprises a combination entity having input terminals coupled to the first and
second node to receive first and second input signals and having an output terminal coupled to the input of the second sigma-delta modulator to provide an output signal based on combinations of the first and second input signals.

8. The device according to claim 7, wherein the combination entity comprises at least a resistor to combine a first signal corresponding to the first node and a second signal corresponding to a second node in accordance with predetermined first and second weighting factors.

9. The device according to claim 7, wherein the combination entity comprises at least a capacitor to combine the first signal corresponding to the first node and a second signal corresponding to a second node in accordance with predetermined first and second weighting factors.

10. The device according to claim 9, wherein the combination entity comprises an inverter to invert one of the first and second signals.

11. The device according to claim 1, wherein the first and second node are provided upstream of a sampler of the first sigma-delta modulator.

12. The device according to claim 1, wherein the first sigma-delta modulator represents a first stage of a cascaded sigma-delta modulator and the second sigma-delta modulator represents a second stage of a cascaded sigma-delta modulator.

13. The device according to claim 12, wherein the first and second sigma-delta modulators are continuous-time sigma-delta modulators.

14. The device according to claim 1, wherein the circuitry couples the first and second node to an input of the second sigma-delta modulator.

15. A method comprising:
generating a combined signal by combining a first signal at a first node upstream of a quantizer of a first sigma-delta modulator, a second signal at a second node upstream of the quantizer of the first sigma-delta modulator and a third signal at a third node upstream of the quantizer of the first sigma-delta modulator; and
providing the combined signal to an input of a second quantizer.

16. The method according to claim 15, wherein the first and second circuit nodes are selected from the group comprising an input of the first sigma-delta modulator, a node between a first integrator entity and a second integrator entity and a node between the second integrator entity and the quantizer of the first sigma-delta modulator.

17. The method according to claim 16, wherein the first and second signals are linearly combined.

18. The method according to claim 17, wherein the first and second signals are combined according to predetermined weighting factors.

19. A modulator comprising:
a first continuous-time sigma-delta modulator, the first sigma-delta modulator comprising a first quantizer;
a second quantizer;
circuitry to couple the first continuous-time sigma-delta modulator to the input of the second quantizer; and
a feedback-path to couple a signal representing an error of the second quantizer to the first continuous-time sigma-delta modulator.

20. The modulator according to claim 19, wherein the modulator comprises a second sigma-delta modulator, the second sigma-delta modulator comprising the second quantizer.

21. The modulator according to claim 19, wherein the feedback path couples a first node upstream of the second quantizer and a second node upstream of the second quantizer to the first continuous-time sigma-delta modulator.

22. The modulator according to claim 19, wherein the circuitry couples a third node upstream of the first quantizer and a fourth node upstream of the first quantizer to the input of the second quantizer.

23. The modulator according to claim 19, wherein the circuitry connects a third node upstream of the first quantizer and a fourth node downstream of the first quantizer to the input of the second quantizer.

24. A cascaded sigma-delta modulator comprising:
a first stage, the first stage comprising a first quantizer;
a second stage, the second stage comprising a second quantizer;
a first path to receive a first signal representing a first error of the first quantizer and to provide a scaled second signal based on the first signal with a first scaling factor to the input of the second quantizer;
a second path to receive a third signal representing a second error of the second quantizer and to provide a scaled fourth signal based on the third signal with a second scaling factor to the first stage, wherein the product of the first and second scaling factor is less than 1;
second circuitry to combine the output of the first quantizer and the second quantizer.

25. The device according to claim 24, wherein the second path comprises a variable-gain element.

26. The device according to claim 24, wherein the product of the first and second scaling factors is lower than 0.3.

27. The device according to claim 24, wherein the scaling factor of the second path is adjusted to provide a zero in the global noise transfer function of the device.

28. The device according to claim 24, further comprising at least a first and second digital noise cancellation filter, wherein the digital noise cancellation filters are provided with only real-part filtering characteristics.

29. The device according to claim 24, wherein the second scaling factor is adjusted to match at least one of the digital noise cancellation filters to a transfer function of at least one stage.

* * * * *